(12) United States Patent
Suda

(10) Patent No.: US 7,782,075 B2
(45) Date of Patent: Aug. 24, 2010

(54) ELECTRONIC DEVICE, LOAD FLUCTUATION COMPENSATION CIRCUIT, POWER SUPPLY, AND TEST APPARATUS

(75) Inventor: Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 344 days.

(21) Appl. No.: 12/049,394

(22) Filed: Mar. 17, 2008

(65) Prior Publication Data
US 2009/0160536 A1    Jun. 25, 2009

Related U.S. Application Data

(63) Continuation of application No. PCT/JP2006/317825, filed on Sep. 8, 2006.

(30) Foreign Application Priority Data
Sep. 27, 2005    (JP) ............................... 2005-280643

(51) Int. Cl.
*G01R 31/26* (2006.01)
(52) U.S. Cl. ...................... 324/765; 324/158.1; 323/312
(58) Field of Classification Search .................. 702/82; 323/300, 234, 220, 299, 312; 324/765, 158.1; 327/60–90
See application file for complete search history.

(56) References Cited

U.S. PATENT DOCUMENTS

| 5,747,972 | A  | * | 5/1998  | Baretich et al. ............. 323/223 |
| 6,163,195 | A  | * | 12/2000 | Jefferson ..................... 327/262 |
| 6,646,488 | B2 | * | 11/2003 | Ajit .............................. 327/262 |
| 7,688,098 | B2 | * | 3/2010  | Kajita .......................... 324/763 |
| 7,714,600 | B2 | * | 5/2010  | Hasumi et al. ............... 324/763 |
| 2009/0287431 | A1 | * | 11/2009 | Suda ........................... 702/58 |
| 2010/0039078 | A1 | * | 2/2010  | Suda ........................... 323/212 |

FOREIGN PATENT DOCUMENTS

| JP | 08-130449   | 5/1996 |
| JP | 2003-124795 | 4/2003 |
| JP | 2003-258617 | 9/2003 |

* cited by examiner

*Primary Examiner*—Ha Tran T Nguyen
*Assistant Examiner*—Richard Isla Rodas
(74) *Attorney, Agent, or Firm*—Jianq Chyun IP Office

(57) ABSTRACT

Provided is a load fluctuation compensation circuit, including a first delay circuitry section that delays a clock signal supplied thereto by a delay amount that fluctuates by a prescribed first fluctuation amount in relation to a unit fluctuation amount of a power supply voltage supplied to a performance circuit; a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the performance circuit; a load circuit that is connected to a common power supply wiring in parallel with the performance circuit; and a phase detecting section that detects a phase difference between the clock signal output by the first delay circuitry section and the clock signal output by the second delay circuitry section and that controls an amount of current consumed by the load circuit based on the detected phase difference.

11 Claims, 13 Drawing Sheets

ELECTRONIC DEVICE, LOAD FLUCTUATION COMPENSATION CIRCUIT, POWER SUPPLY, AND TEST APPARATUS

CROSS REFERENCE TO RELATED APPLICATION

This is a continuation application of PCT/JP2006/317825 filed on Sep. 8, 2006 which claims priority from a Japanese Patent Application No. 2005-280643 filed on Sep. 27, 2005, the contents of which are incorporated herein by reference.

BACKGROUND

1. Technical Field

The present invention relates to an electronic device that compensates fluctuation of a supply power supplied to a performance circuit, a load fluctuation compensation circuit that compensates fluctuation of a supply power supplied to an electronic device such as a semiconductor circuit, a power supply apparatus provided with the load fluctuation compensation circuit, and a test apparatus provided with the power supply apparatus. More particularly, the present invention relates to an electronic device that compensates a power supply voltage fluctuation caused by a fluctuation in a current consumed by a performance circuit.

2. Related Art

In conventional testing, a supply power for driving is supplied to an electronic device such as a semiconductor circuit, a supply power for driving the electronic device is supplied. For example, a power supply apparatus of a test apparatus supplies the supply power to the electronic device via power supply wiring.

No related Patent Documents or the like are known at present.

In an electronic device such as a CMOS circuit, a consumed current fluctuates according to a fluctuation in operational efficiency of elements included in the electronic device. In such a case, an amount of a voltage drop in a power supply voltage supplied to the circuit of the electronic device fluctuates together with the fluctuation of the consumed current in accordance with an impedance of the power supply wiring connecting the power supply apparatus and the electronic device, the impedance of the power supply wiring inside the electronic device, and an output impedance of the power supply apparatus.

When the fluctuation occurs in the power supply voltage as described above, accurate testing of the electronic device cannot be expected. This type of problem may be solved by preparing a power supply voltage that compensates the fluctuation by detecting the fluctuation of the power supply voltage and feeding the thus detected fluctuation back to the power supply apparatus. For example, when dealing with a DC component of the power supply voltage fluctuation, the power supply voltage supplied to the electronic device can be compensated to be a suitable value by detecting the voltage fluctuation near the power supply input end of the electronic device. Detecting the power supply voltage fluctuation near the power supply input end of the electronic device requires a sense path that branches from the power supply wiring at a location near the power supply input end.

However, because the sense path branches from the power supply wiring, the power supply current partially flows on the sense path. It is necessary to increase the impedance of the sense path to decrease the amount of current flowing to the branch. However, the increase of the impedance of the sense path causes the time constant of the sense path to be undesirably large. Furthermore, it is necessary to provide a large power transistor capable of generating a large power at an output of the power supply apparatus in order to be able to output a large amount of power.

Therefore, it is difficult to have a power supply voltage output that quickly follows the power supply voltage fluctuation near the power supply input end of the electronic device. For example, a low frequency component of the power supply voltage fluctuation can be compensated, but not voltage fluctuation with a period faster than the response speed of the power supply apparatus, which is determined by the size of the power transistor, the time constant of the sense path, and the like.

The fluctuation of the power supply current and of the power supply voltage in relation to the load fluctuation, in other words, load regulation, is especially problematic in semiconductor circuits, which have seen higher integration in recent years, because it leads to noise in peripheral circuits. This leads to the desire for a load fluctuation compensation circuit that can quickly track the power supply voltage fluctuation.

SUMMARY

Therefore, it is an object of an aspect of the innovations herein to provide an electronic device, a load fluctuation compensation circuit, a power supply apparatus, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include an electronic device that outputs an output signal in response to an input signal supplied thereto, including a performance circuit that is supplied with the input signal and that outputs the output signal, a power supply wiring that receives a supply power from outside and supplies the supply power to the performance circuit, and a load fluctuation compensation circuit, branching from the power supply wiring, that compensates a fluctuation of the supply power supplied to the performance circuit. In the electronic device, the load fluctuation compensation circuit includes a first delay circuitry section that delays a clock signal supplied thereto by a delay amount that fluctuates by a prescribed first fluctuation amount in relation to a unit fluctuation amount of a power supply voltage supplied to the performance circuit; a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the performance circuit; a load circuit that is connected to the power supply wiring in parallel with the performance circuit; and a phase detecting section that detects a phase difference between the clock signal output by the first delay circuitry section and the clock signal output by the second delay circuitry section and that controls an amount of current consumed by the load circuit based on the detected phase difference.

According to a second aspect related to the innovations herein, one exemplary apparatus may include a load fluctuation compensation circuit that compensates a fluctuation of supply power supplied to an electronic device, including a first delay circuitry section that delays a clock signal supplied thereto by a delay amount that fluctuates by a: prescribed first fluctuation amount in relation to a unit fluctuation amount of a power supply voltage supplied to the electronic device; a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device; a load circuit that is connected to a common power supply wiring in parallel with the electronic device; and a phase detecting section that detects a phase difference between the clock signal output by the first delay circuitry section and the clock signal output by the second delay circuitry section and that controls an amount of current consumed by the load circuit based on the detected phase difference.

According to a third aspect related to the innovations herein, one exemplary apparatus may include a power supply apparatus that supplies a supply power to an electronic device, including a power supply circuit that generates the supply power supplied to the electronic device and a load fluctuation compensation circuit that compensates a fluctuation of the supply power supplied to the electronic device. In the power supply apparatus, the load fluctuation compensation circuit includes a first delay circuitry section that delays a clock signal supplied thereto by a delay amount that fluctuates by a prescribed first fluctuation amount in relation to a unit fluctuation amount of a power supply voltage supplied to the electronic device; a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device; a load circuit that is disposed in parallel with the electronic device and that has at least a portion of a power supply wiring in common with the electronic device; and a phase detecting section that detects a phase difference between the clock signal output by the first delay circuitry section and the clock signal output by the second delay circuitry section and that controls an amount of current consumed by the load circuit based on the detected phase difference.

According to a fourth aspect related to the innovations herein, one exemplary apparatus may include a test apparatus that tests an electronic device, including a pattern generating section that inputs a test signal to the electronic device, a judging section that makes a judgment concerning pass/fail of the electronic device based on an output signal of the electronic device, and a power supply apparatus that supplies a supply power to the electronic device. In the test apparatus, the power supply apparatus includes a power supply circuit that generates the supply power supplied to the electronic device and a load fluctuation compensation circuit that compensates a fluctuation of the supply power supplied to the electronic device. Furthermore, in the test apparatus, the load fluctuation compensation circuit includes a first delay circuitry section that delays a clock signal supplied thereto by a delay amount that fluctuates by a prescribed first fluctuation amount in relation to a unit fluctuation amount of a power supply voltage supplied to the electronic device; a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device; a load circuit that is disposed in parallel with the electronic device and that has at least a portion of a power supply wiring in common with the electronic device; and a phase detecting section that detects a phase difference between the clock signal output by the first delay circuitry section and the clock signal output by the second delay circuitry section and that controls an amount of current consumed by the load circuit based on the detected phase difference.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

By using the embodiments of the present invention, the power supply voltage fluctuation caused by the fluctuation of the current consumed by the performance circuit can be compensated. Furthermore, by controlling the current consumed by the load circuit disposed near the performance circuit without feeding the fluctuation of the power supply voltage back to the power supply circuit, load fluctuation can be tracked quickly according to the compensation of the power supply voltage fluctuation.

BRIEF DESCRIPTION OF THE DRAWINGS

FIG. 10 shows an exemplary configuration of the bias generating section 78 that generates the bias voltages described in FIGS. 7 to 9.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
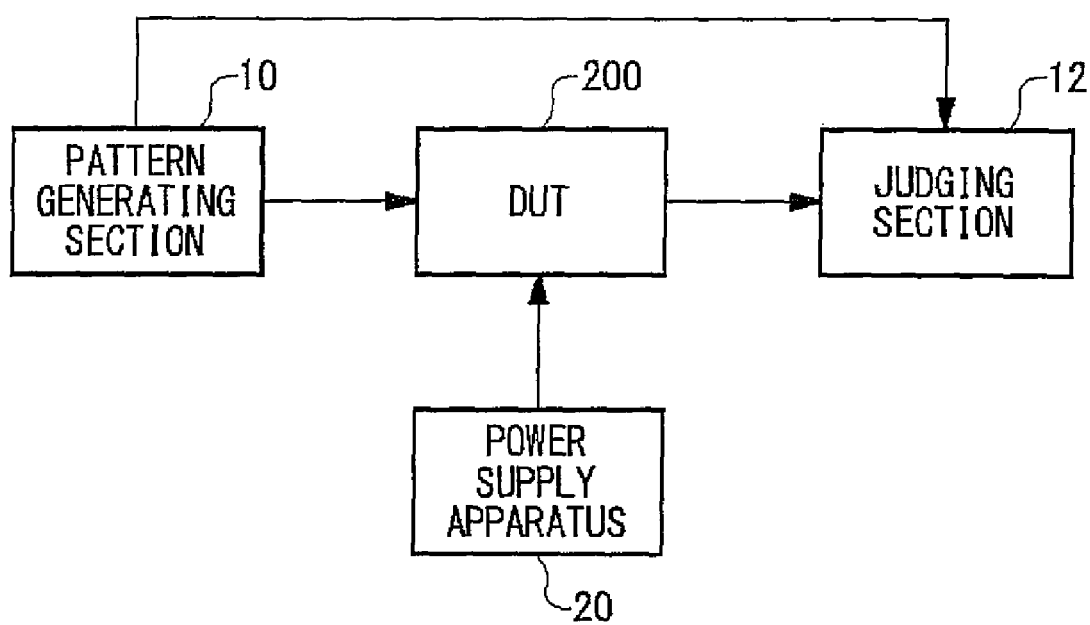
FIG. 1 shows an exemplary configuration of the test apparatus 100 according to an embodiment of the present invention.

FIG. 1 shows an exemplary configuration of a test apparatus 100 according to an embodiment of the present invention. The test apparatus 100 tests an electronic device 200 such as a semiconductor circuit and is provided with a pattern generating section 10, a judging section 12, and a power supply apparatus 20.

The pattern generating section 10 inputs a test signal into the electronic device 200. For example, when performing a functional test of the electronic device 200, the pattern generating section 10 may input thereto a test pattern that operates the electronic device 200. Furthermore, the pattern generating section 10 generates an expected value signal that indicates an expected value of the signal that the electronic device 200 outputs.

The judging section 12 makes a judgment concerning pass/fail of the electronic device 200 based on the output signal of the electronic device 200. The judging section 12 of the present embodiment makes the judgment concerning pass/fail of the electronic device 200 by comparing the expected value signal generated by the pattern generating section 10 to the output signal of the electronic device 200. Furthermore, the power supply apparatus 20 supplies a supply power to the electronic device 200.

Figure 2:
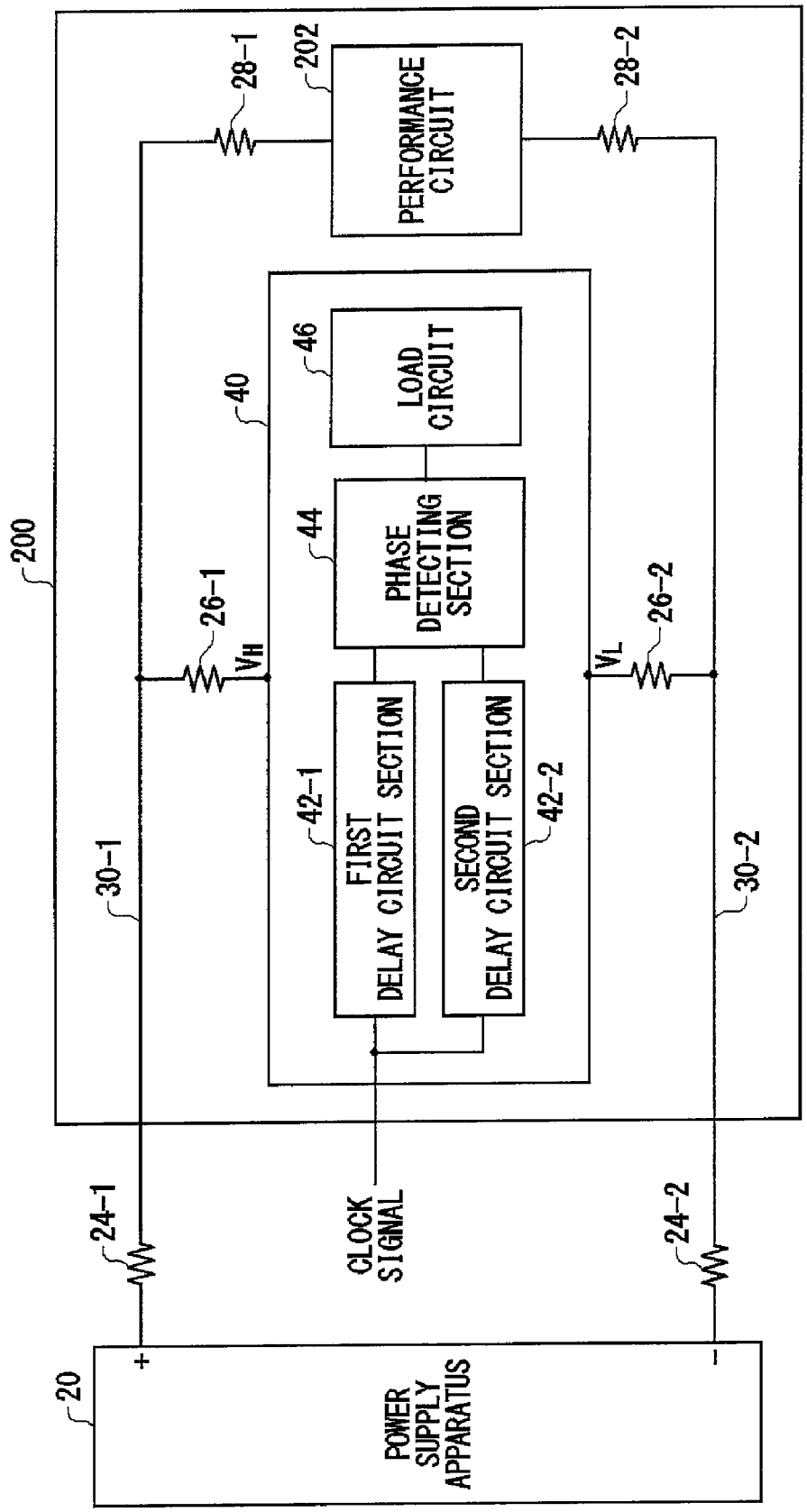
FIG. 2 shows an exemplary configuration of the electronic device 200.

FIG. 2 shows an exemplary configuration of the electronic device 200. The electronic device 200 outputs a signal in response to an input signal supplied thereto, and is provided with a performance circuit 202, power supply wirings 30-1 and 30-2 (referred to hereinafter collectively as 30), and a load fluctuation compensation circuit 40. The performance circuit 202 outputs a signal in response to an input signal, and may be a CMOS ASIC, for example. The power supply wirings 30 receive the supply power generated by the external power supply apparatus 20 and supply the received power to the performance circuit 202. The power supply apparatus 20 generates the supply power and supplies the power to the electronic device 200. The power supply apparatus 20 of the present embodiment includes a positive output terminal and a negative output terminal, which are respectively connected to a positive power supply input terminal and a negative power supply input terminal of the performance circuit 202 via the positive power supply wiring 30-1 and the negative power supply wiring 30-2 of the electronic device 200.

The power supply wirings 30 branch into main power supply wirings 28-1 and 28-2 (referred to hereinafter collectively as 28) and branch power supply wirings 26-1 and 26-2 (referred to hereinafter collectively as 26) at an area near the power supply input terminals of the performance circuit 202. The main power supply wirings 28 connect the power supply apparatus 20 to the performance circuit 202 and supply the supply power to the performance circuit 202. The branch power supply wirings 26 connect the power supply apparatus 20 to the load fluctuation compensation circuit 40 and supply the supply power to the load fluctuation compensation circuit 40. In the present embodiment, the performance circuit 202 and the load fluctuation compensation circuit 40 are configured in the same chip.

Here, the branching points near the power supply input terminals of the performance circuit 202 may be positioned such that impedances of the main power supply wirings 28 from the branching point to the performance circuit 202 are substantially zero or are small enough as to be essentially ignored. The branching points should at least be arranged at positions such that the impedances of the main power supply wirings 28 from the branching points to the performance circuit 202 are less than the impedances of wirings 24 from the power supply apparatus 20 to the branching points. In the present embodiment, the performance circuit 202 and the branching points are configured on the same chip. Furthermore, a power transmission distance from the power supply apparatus 20 to the electronic device 200 is extremely large in comparison to the power transmission distance within the electronic device 200. Therefore, the impedances of the main power supply wirings 28 are extremely small in comparison to the impedances of the wirings 24.

It is desirable that the branching points be positioned such that the impedances of the branch power supply wirings 26 also be substantially zero or be small enough as to be essentially ignored. Furthermore, the branching points may be positioned such that the impedances of the main power supply wirings 28 from the branching points to the performance circuit 202 are substantially equal to the impedances of the branch power supply wirings 26.

The load fluctuation compensation circuit 40 compensates the fluctuation of the supply power supplied to the performance circuit 202. The load fluctuation compensation circuit 40 of the present embodiment includes a first delay circuitry section 42-1, a second delay circuitry section 42-2, a phase detecting section 44, and a load circuit 46. In a case where the electronic device 200 is provided with a plurality of performance circuits 202, the electronic device 200 may be provided with a plurality of load fluctuation compensation circuits 40 corresponding to the plurality of performance circuits 202 and with wirings corresponding to each load fluctuation compensation circuit 40.

The first delay circuitry section 42-1 delays a clock signal provided thereto by a delay amount that fluctuates by a prescribed first fluctuation amount in relation to a unit fluctuation amount of the power supply voltage supplied to the performance circuit 202. The second delay circuitry section 42-2 delays a clock signal provided thereto by a delay amount that fluctuates by a second fluctuation amount, which is greater than the first fluctuation amount, in relation to the unit fluctuation amount of the power supply voltage supplied to the performance circuit 202. The first delay circuitry section 42-1 and the second delay circuitry section 42-2 of the present embodiment are supplied with the power supply voltage via the branch power supply wirings 26 and have delay amounts that fluctuate according to the fluctuation of the supplied power supply voltage.

In the present embodiment, a case is described in which the second fluctuation amount of the second delay circuitry section 42-2 is greater than the first fluctuation amount of the first delay circuitry section 42-1, but in other examples the first fluctuation amount may be greater than the second fluctuation amount. In other words, the fluctuation amounts of the delay amounts in relation to the unit fluctuation amount of the power supply voltage may be different in the first delay circuitry section 42-1 and the second delay circuitry section 42-2. The load fluctuation compensation circuit 40 can perform equivalent operations in a case where one of either the first fluctuation amount or the second fluctuation amount is larger than the other.

The load circuit 46 is disposed in parallel with the performance circuit 202 and has at least a portion of the power supply wirings in common with the performance circuit 202. The load circuit 46 of the present embodiment has the power supply wirings 30 in common with the performance circuit 202 and receives the supply power from the branch power supply wirings 26.

The phase detecting section 44 detects a phase difference between the clock signal output by the first delay circuitry section 42-1 and the clock signal output by the second delay circuitry section 42-2, and controls the amount of current consumed by the load circuit 46 based on the detected phase difference. For example, the load circuit 46 may be a circuit that can switch whether a predetermined current is consumed via the branch power supply wirings 26, and the phase detecting section 44 may switch whether the current is consumed by the load circuit 46 based on which of either the clock signal output by the first delay circuitry section 42-1 or the clock signal output by the second delay circuitry section 42-2 has a phase that is further ahead. As another example, the load circuit 46 may be a circuit that can fluctuate the amount of current consumed, and the phase detecting section 44 may control the amount of current consumed by the load circuit 46 based on the aforementioned phase difference.

Figure 3:
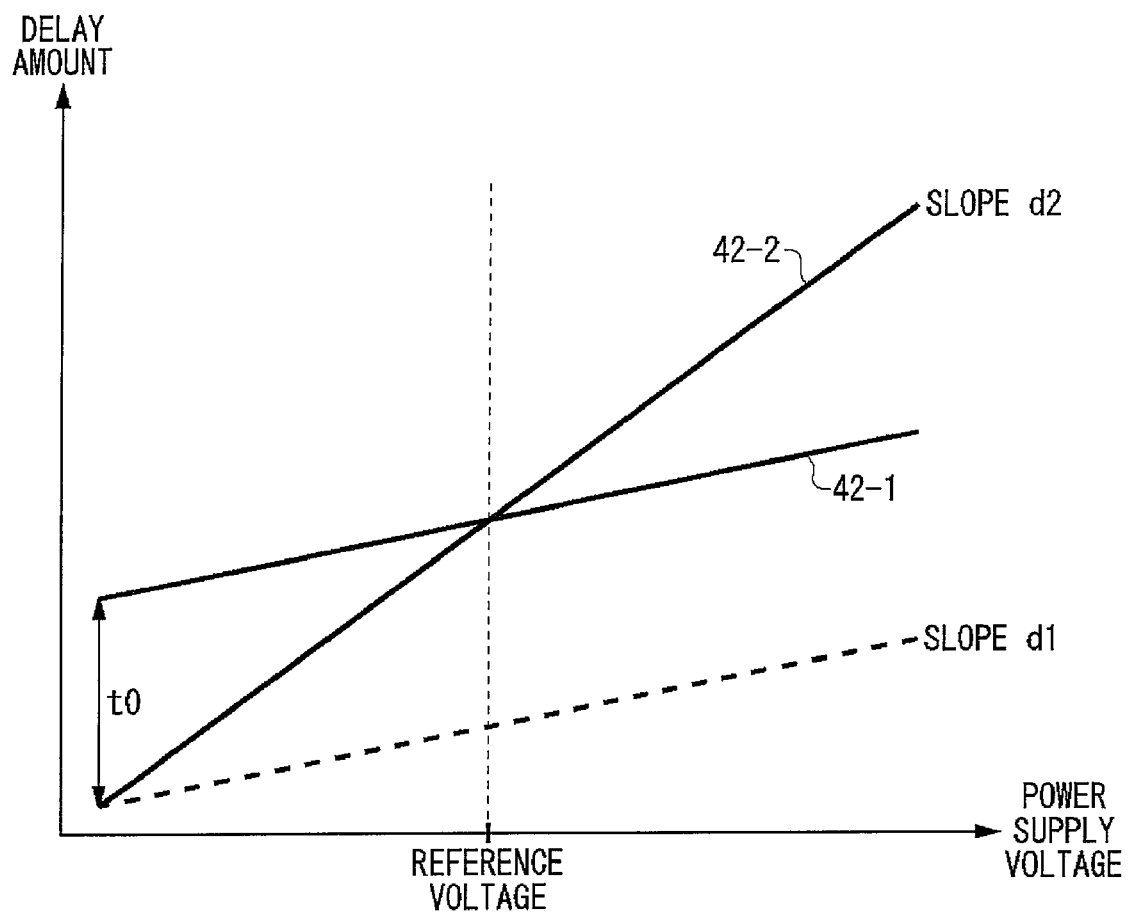
FIG. 3 shows an exemplary relationship between the power supply voltage and the delay amounts in the first delay circuitry section 42-1 and the second delay circuitry section 42-2.

FIG. 3 shows an exemplary relationship between the power supply voltage and the delay amounts in the first delay circuitry section 42-1 and the second delay circuitry section 42-2. In the present embodiment, a case is described in which the second fluctuation amount is greater than the first fluctuation amount. In other words, as shown in FIG. 3, a case is described in which a slope representing the relationship between the power supply voltage and the delay amount characteristic is greater for the second delay circuitry section 42-2 than for the first delay circuitry section 42-1.

The delay amounts in the first delay circuitry section 42-1 and the second delay circuitry section 42-2 are set to be the same when the power supply voltage supplied to the performance circuit 202 is a prescribed reference voltage. For example, as shown by the dotted line in FIG. 3, the first delay circuitry section 42-1 includes a delay element, which has a power supply voltage-delay amount characteristic slope that is less than that of the second delay circuitry section 42-2, and a phase difference generating section that delays the supplied clock signal by a delay time t0 and inputs the thus delayed signal to the delay element. By controlling the delay time t0 of the phase difference generating section, the delay amounts of the first delay circuitry section 42-1 and the second delay circuitry section 42-2 become substantially the same at the prescribed reference voltage. The reference voltage may be a voltage that is substantially equal to the power supply voltage to be supplied to the performance circuit 202 or may be a voltage that is substantially equal to the regular voltage of the performance circuit 202, for example.

The phase detecting section 44 controls the amount of current consumed by the load circuit 46 such that the phase difference between the clock signal output by the first delay circuitry section 42-1 and the clock signal output by the second delay circuitry section 42-2 becomes a predetermined phase difference. In the present embodiment, the phase detecting section 44 controls the amount of current consumed by the load circuit 46 such that the phase difference becomes substantially zero.

As shown in FIG. 3, the phase difference becomes substantially zero when the delay amount of the first delay circuitry section 42-1 is substantially equal to the delay amount of the second delay circuitry section 42-2. In other words, the phase detecting section 44 controls the amount of current consumed by the load circuit 46 such that the power supply voltage supplied to the first delay circuitry section 42-1 and the second delay circuitry section 42-2 becomes the prescribed reference voltage shown in FIG. 3.

For example, when the amount of current consumed by the performance circuit 202 decreases, the amount of the voltage drop caused by the impedance component of the wiring 24 also decreases. In other words, the power supply voltage supplied to the performance circuit 202 becomes greater than the reference voltage. In such a case, because the delay amount of the second delay circuitry section 42-2 becomes greater than the delay amount of the first delay circuitry section 42-1, as shown in FIG. 3, the phase of the clock signal output by the first delay circuitry section 42-1 moves ahead of the phase of the clock signal output by the second delay circuitry section 42-2.

In a case where the phase of the clock signal output by the first delay circuitry section 42-1 moves ahead of the phase of the clock signal output by the second delay circuitry section 42-2, the phase detecting section 44 increases the amount of current consumed by the load circuit 46. For example, the phase detecting section 44 turns the load circuit 46 on to consume the prescribed amount of current. Because the load circuit 46 receives the power supply current via the power supply wirings 30, the control described above increases the amount of power supply current flowing to the power supply wirings 30. By doing this, the increase in the power supply voltage caused by the decrease in the amount of current consumed by the performance circuit 202 can be compensated.

When the amount of current consumed by the performance circuit 202 increases, the power supply voltage supplied to the performance circuit 202 becomes smaller than the reference voltage. In such a case, the phase of the clock signal output by the first delay circuitry section 42-1 falls behind the phase of the clock signal output by the second delay circuitry section 42-2.

In a case where the phase of the clock signal output by the first delay circuitry section 42-1 falls behind the phase of the clock signal output by the second delay circuitry section 42-2, the phase detecting section 44 decreases the amount of current consumed by the load circuit 46. For example, the phase detecting section 44 turns off the load circuit 46, which causes the consumed current to be substantially zero. By doing this, the decrease in the power supply voltage caused by the increase in the current consumed by the performance circuit 202 can be compensated.

By using the load fluctuation compensation circuit 40 of the present embodiment, the power supply voltage fluctuation caused by the fluctuation of the current consumed by the performance circuit 202 can be compensated, as described above. Furthermore, by controlling the current consumed by the load circuit 46 disposed in the electronic device 200 without feeding the fluctuation of the power supply voltage back to the power supply apparatus 20, load fluctuation can be tracked quickly according to the compensation of the power supply voltage fluctuation. Particularly, because the power supply voltage fluctuation can be compensated by switching the load circuit 46 on and off, the load fluctuation can be tracked quickly with simple control.

Figure 4:
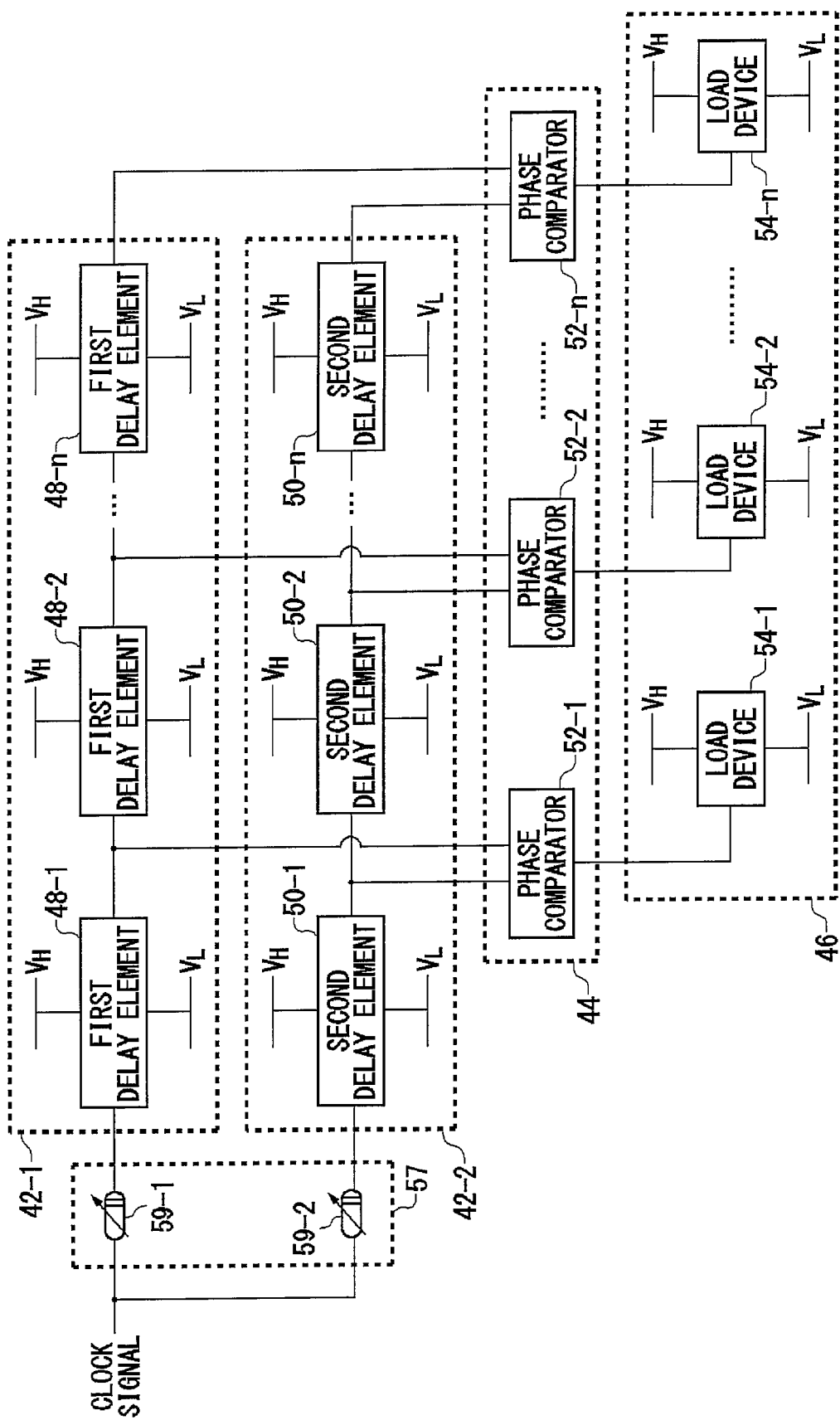
FIG. 4 shows another exemplary configuration of the load fluctuation compensation circuit 40.

FIG. 4 shows another exemplary configuration of the load fluctuation compensation circuit 40. The load fluctuation compensation circuit 40 of the present embodiment is further provided with a phase difference generating section 57 in addition to the configuration of the load fluctuation compensation circuit 40 described in FIG. 2. Furthermore, the first delay circuitry section 42-1 of the present embodiment includes n (where n is a natural number) first delay elements 48-1~48-n (referred to hereinafter collectively as 48) connected in series. The second delay circuitry section 42-2 of the present embodiment includes n second delay elements 50-1~50-n (referred to hereinafter collectively as 50) connected in series. The phase detecting section 44 includes n phase comparators 52-1~52-n (referred to hereinafter collectively as 52). The load circuit 46 includes n load devices 54-1~54-n (referred to hereinafter collectively as 54).

The plurality of first delay elements 48 are connected in a cascading manner and sequentially delay a clock signal supplied thereto. Each first delay element 48 is supplied with a power supply voltage (VH, VL) from the branch power supply wirings 26 and causes a delay according to the supplied power supply voltage. The delay amount of each first delay element 48 is substantially equal. For example, the delay amount of each first delay element 48 may be a delay amount obtained by dividing the delay amount shown by the dotted line of FIG. 3 by n. The delay amount of each first delay element may be equal to d1 multiplied by V, for example. Here, d1 represents the fluctuation amount of the delay amount in relation to the unit fluctuation amount of the power supply voltage supplied to the first delay elements 48, and is controlled by a bias voltage supplied to the first delay elements 48, for example. V represents the power supply voltage supplied to the first delay elements 48.

The plurality of second delay elements 50 are connected in a cascading manner and sequentially delay a clock signal supplied thereto. Each second delay element 50 is supplied with the power supply voltage (VH, VL) from the branch power supply wirings 26 and causes a delay according to the supplied power supply voltage. The delay amount of each second delay element 50 is substantially equal. For example, the delay amount of each second delay element 50 may be a delay amount obtained by dividing the delay amount of the second delay circuitry section 42-2 shown in FIG. 3 by n. The delay amount of each second delay element 50 may be equal to d2 multiplied by V, for example. Here, d2 represents the fluctuation amount of the delay amount in relation to the unit fluctuation amount of the power supply voltage supplied to the second delay elements 50, and is controlled by a bias voltage supplied to the second delay elements 50, for example. V represents the power supply voltage supplied to the second delay elements 50, and is substantially the same as the power supply voltage supplied to the first delay elements 48. The fluctuation amount (d2) of the delay amount in relation to the unit fluctuation amount of the power supply voltage in the second delay elements 50 is greater than the fluctuation amount (d1) of the delay amount in relation to the unit fluctuation amount of the power supply voltage in the first delay elements 48.

The phase difference generating section 57 creates the prescribed phase difference between the clock signal input into the first delay circuitry section 42-1 and the clock signal input into the second delay circuitry section 42-2. The phase difference generating section 57 of the present embodiment includes at least one of a variable delay circuit 59-1 that delays the clock signal input into the first delay circuitry section 42-1 and a variable delay circuit 59-2 that delays the clock signal input into the second delay circuitry section 42-2. The phase difference generating section 57 delays one of the clock signal input to the first delay circuitry section 42-1 and the clock signal input to the second delay circuitry section 42-2 by a prescribed amount of time. The delay amounts of the variable delay circuits 59 are constant, regardless of the power supply voltage supplied to the load fluctuation compensation circuit 40. It is desirable that the load fluctuation compensation circuit 40 include a section that supplies a constant power supply voltage to the variable delay circuits 59.

In the present embodiment, when the power supply voltage supplied to the performance circuit 202 is the prescribed reference voltage, the phase difference generating section 57 delays the clock signal provided to the first delay circuitry section 42-1 or to the second delay circuitry section 42-2 such that the phase of the clock signal output by the first delay element 48 at a substantially middle stage of the first delay circuitry section 42-1 becomes substantially equal to the phase of the clock signal output by the second delay element 50 at a substantially middle stage of the second delay circuitry section 42-2. For example, in a case where the delay amount of the second delay element 50 is greater than the delay amount of the first delay element 48, the phase difference generating section 57 delays the clock signal input into the first delay circuitry section 42-1 by the prescribed amount of time.

The plurality of phase comparators 52 are disposed to correspond to the plurality of first delay elements 48 and to the plurality of second delay elements 50. Each phase comparator 52 detects the phase difference between the clock signal output by the corresponding first delay element 48 and the clock signal output by the corresponding second delay element 50. In the present embodiment, because the phase of the clock signal supplied to the first delay circuitry section 42-1 is behind the phase of the clock signal supplied to the second delay circuitry section 42-2 and because the delay amounts of the second delay elements 50 are greater than the delay amounts of the first delay elements 48, the phase relationship of the clock signals output from a delay element at a certain stage in the first delay circuitry section 42-1 and in the second delay circuitry section 42-2 is inverted.

For example, in delay elements that are upstream from the delay element at the aforementioned stage, the phase of the clock signal output by the first delay element 48 is behind the phase of the clock signal output by the second delay element 50. Furthermore, in delay elements that are downstream from the delay element at the aforementioned stage, the phase of the clock signal output by the first delay element 48 is ahead of the phase of the clock signal output by the second delay element 50. Therefore, the phase comparators 52 corresponding to the delay elements that are upstream from the delay element at the aforementioned stage output signals having logic H, for example, as the phase comparison result, and the phase comparators corresponding to the delay elements that are downstream from the delay element at the aforementioned stage output signals having logic L, for example, as the phase comparison result.

The plurality of load devices 54 are disposed to correspond to the plurality of phase comparators 52. Each load device 54 switches whether the prescribed amount of current is consumed according to the comparison result of the corresponding phase comparator 52. Each load device 54 is disposed in parallel with the performance circuit 202 and has at least a portion of the power supply wiring in common with the performance circuit 202. The load devices 54 of the present embodiment have the power supply wiring 30 in common with the performance circuit 202 and receive the supply power from the branch power supply wirings 26. The prescribed current amount for each load device 54 may be the same.

In the present embodiment, each phase comparator 52 turns on the corresponding load device 54 to consume the prescribed amount of current when the phase of the clock signal output by the corresponding first delay element 48 is ahead of the phase of the clock signal output by the corresponding second delay element 50. On the other hand, each phase comparator 52 turns off the corresponding load device 54 to set the amount of consumed current to be substantially zero when the phase of the clock signal output by the corresponding first delay element 48 is behind the phase of the clock signal output by the corresponding second delay element 50.

Figure 5:
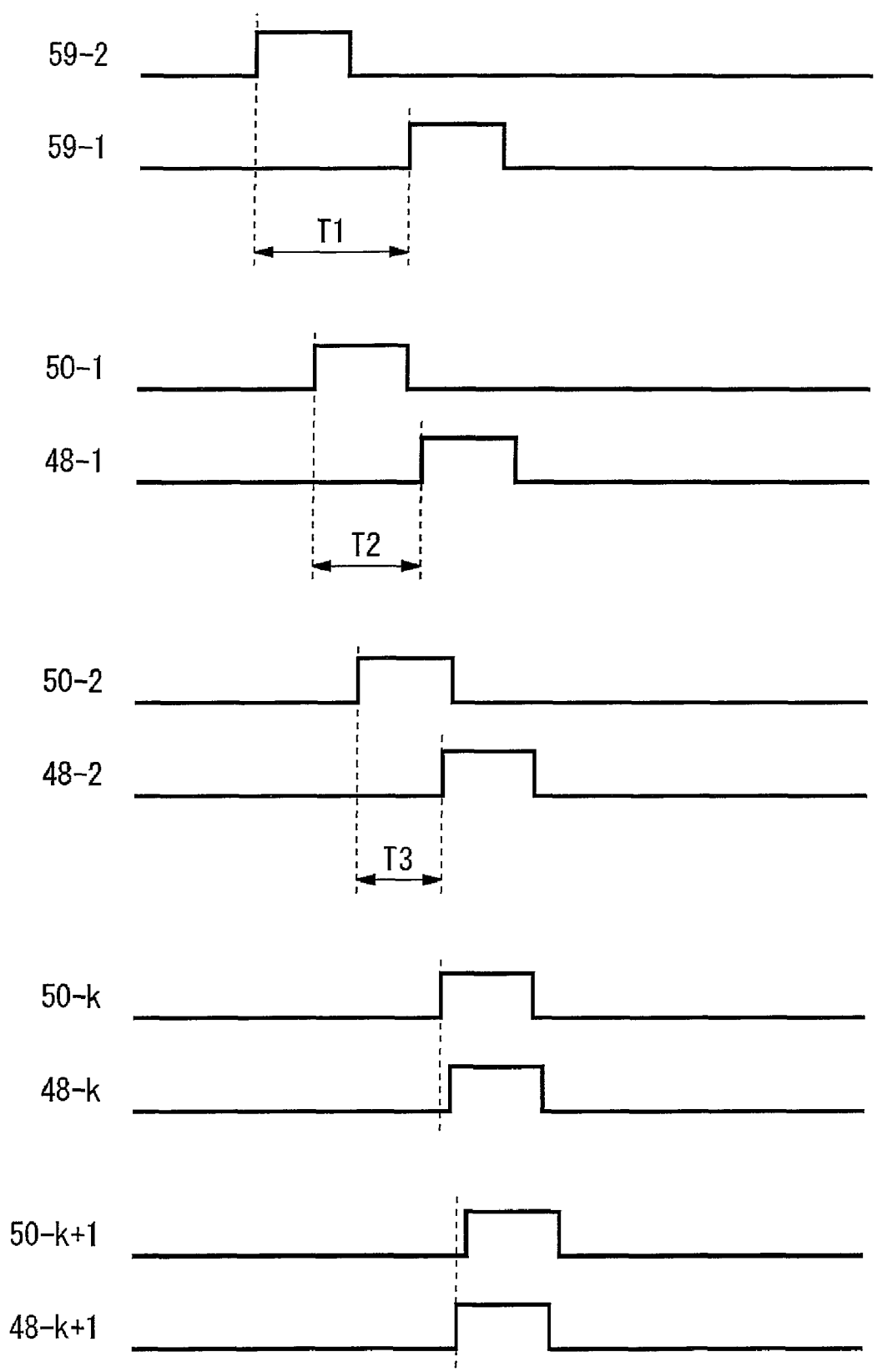
FIG. 5 is a timing chart that describes an exemplary operation of the load fluctuation compensation circuit 40 described in FIG. 4.

FIG. 5 is a timing chart that describes an exemplary operation of the load fluctuation compensation circuit 40 described in FIG. 4. In the present embodiment, a case is described in which the phase difference generating section 57 delays the phase of the clock signal input to the first delay circuitry section 42-1 by a prescribed time T1 in relation to the phase of the clock signal input to the second delay circuitry section 42-2, and inputs the thus delayed signal. Furthermore, in the present embodiment, the delay amounts of the second delay elements 50 are greater than the delay amounts of the first delay elements 48.

First, clock signals are supplied from the variable delay circuit 59-1 and the variable delay circuit 59-2 to the first delay circuitry section 42-1 and the second delay circuitry section 42-2, respectively. As described above, the phase of the clock signal input to the first delay circuitry section 42-1 is delayed by the prescribed phase difference T1 in relation to the phase of the clock signal input to the second delay circuitry section 42-2.

The first delay element 48-1 and the second delay element 50-1 each delay the clock signal supplied thereto and output the thus delayed signal. As described above, the delay amount of the second delay element delay element 50-1 is greater than the delay amount of the first delay element 48-1. Therefore, the phase difference T2 between the clock signal output by the first delay element 48-1 and the clock signal output by the second delay element 50-1 becomes a value T2 obtained by subtracting from the phase difference T1 the delay difference between the delay amounts of the first delay element 48-1 and of the second delay element delay element 50-2.

By passing each clock signal through the plurality of first delay elements 48 and second delay elements 50, the phase difference between the clock signals gradually decreases, and the phase relationship between the clock signals is inverted when the clock signals reach a prescribed first delay element 48-(k+1) and second delay element 50-(k+1). As described above, each phase comparator 52 compares the phases of the clock signals output by the corresponding first delay element 48 and the corresponding second delay element 50 and turns the corresponding load device 54 on or off according to the comparison result.

The stage number of the delay element at which the phases of the clock signals are inverted is determined by the initial phase difference T1 and the delay difference between the delay amounts of the first delay elements 48 and the second delay elements 50. The initial phased difference T1 is set such that the phase of the clock signal output by the first delay element 48 at the substantially middle stage of the first delay circuitry section 42-1 becomes substantially equal to the phase of the clock signal output by the second delay element 50 at the substantially middle stage of the second delay circuitry section 42-2 at a time when the power supply voltage supplied to the electronic device 200 is the prescribed reference voltage, for example.

The delay amounts of the first delay elements 48 and of the second delay elements 50 fluctuate according to the power supply voltage supplied to the performance circuit 202. Therefore, the stage number at which the phase relation of the clock signals is inverted is determined by the supplied power supply voltage. For example, in a case where the power supply voltage is less than the reference voltage, the delay difference between the delay amounts of the first delay elements 48 and the second delay elements 50 is lower than when the reference voltage is supplied. Therefore, the stage number of the delay element at which the phase relation of the clock signals is inverted moves downstream from the middle stage by a number of stages corresponding to the fluctuation amount of the power supply voltage in relation to the reference voltage.

In such a case, the number of load devices 54 turned on decreases according to the number of stages moved, so that the current consumed by the load circuit 46 also decreases. Therefore, the amount of voltage drop in the power supply wiring 30 decreases, so that the fluctuation of the power supply voltage supplied to the performance circuit 202 can be compensated.

Figure 6:
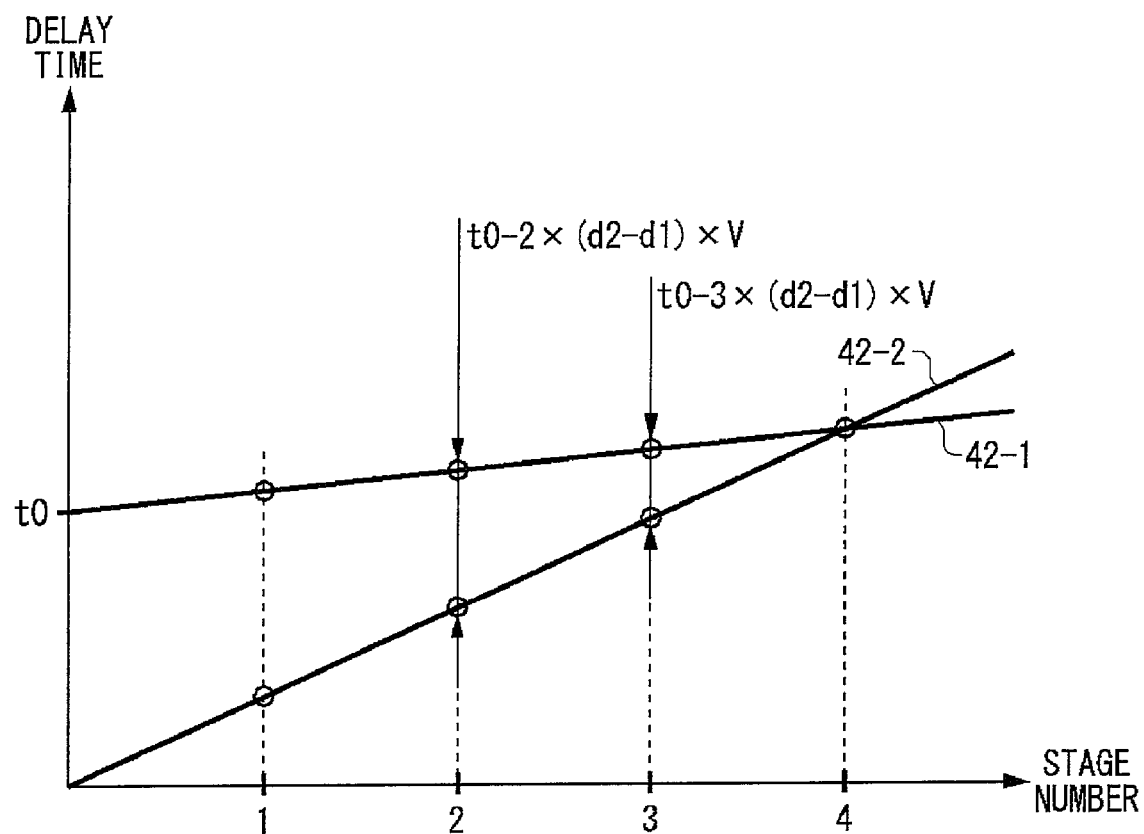
FIG. 6 shows a delay time of the clock signals output by the delay element at each stage in the first delay circuitry section 42-1 and the second delay circuitry section 42-2.

FIG. 6 shows a delay time of the clock signals output by the delay elements at each stage in the first delay circuitry section 42-1 and in the second delay circuitry section 42-2. As described in FIG. 5, the phase of the clock signal output by each delay element is inverted at a stage number corresponding to the delay difference between the delay amounts of the first delay elements 48 and the second delay elements 50. As shown in FIG. 6, the delay difference between the delay amounts of the first delay element 48 and the second delay element 50 for a single stage of the delay element is equal to (d2−d1)×V. Because the delay difference is proportionate to the power supply voltage, it is understood that the stage number at which the phases are inverted changes according to the power supply voltage. The load fluctuation compensation circuit 40 may compensate the fluctuation of the power supply voltage in a voltage range in which the relationship between the fluctuation amount of the power supply voltage and the fluctuation amount of the stage number at which the phases are inverted can be approximated linearly.

Figure 7:
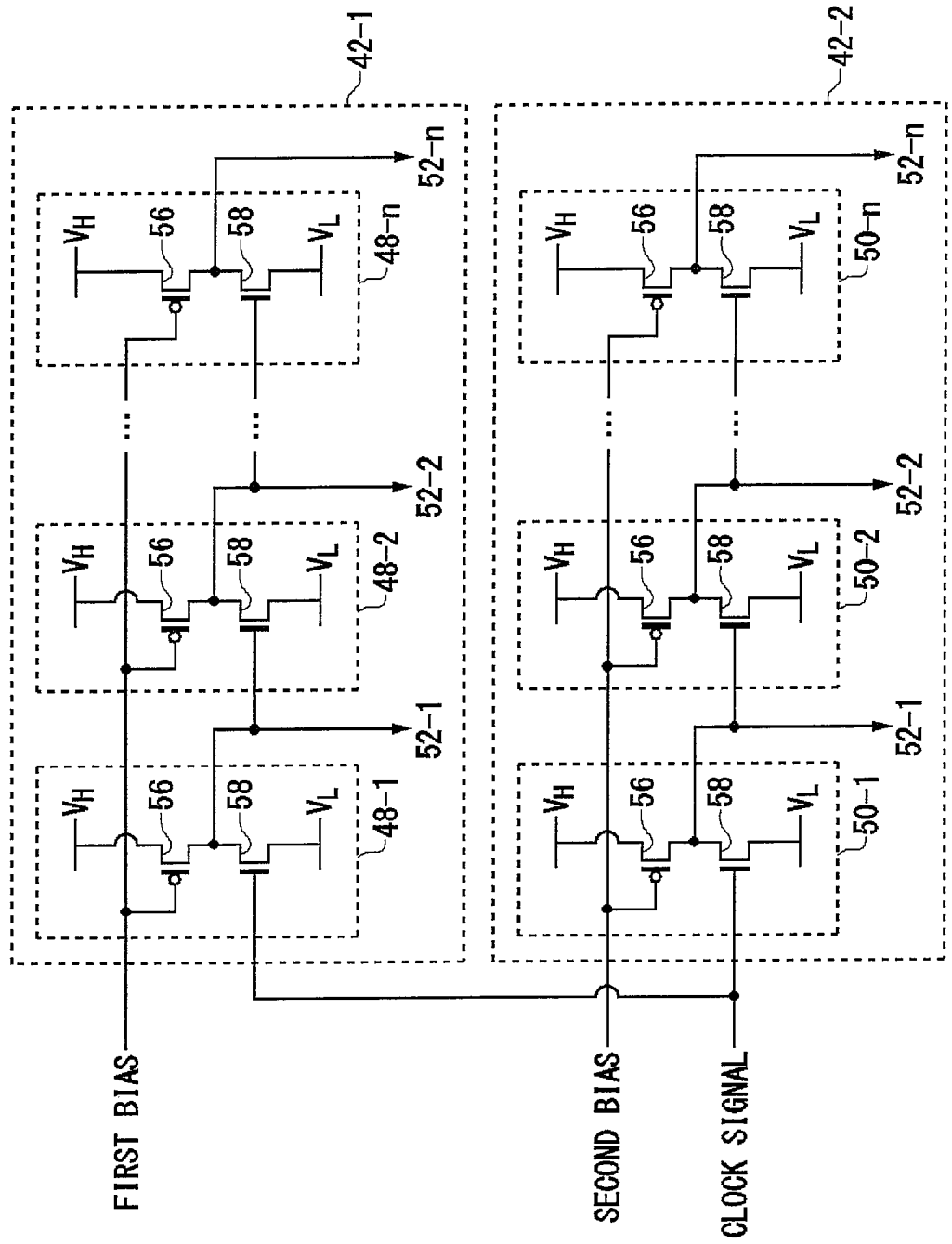
FIG. 7 shows exemplary configurations of the first delay elements 48 and the second delay elements 50.

FIG. 7 shows exemplary configurations of the first delay elements 48 and the second delay elements 50. The first delay elements 48 and the second delay elements 50 may have the same configuration. In the present embodiment, the configuration of a first delay element 48 is described.

The first delay element 48 includes a transistor 56 and a transistor 58. The transistor 56 is, for example, a PMOS transistor having a source terminal receives the positive power supply voltage VH from the branch power supply wiring 26-1, a drain terminal that is connected to the drain terminal of the transistor 58, and a gate terminal that receives a prescribed first bias voltage. In other words, the transistor 56 functions as a current source that regulates the current flowing to the transistor 58 according to the first bias voltage supplied thereto.

The transistor 58 is, for example, an NMOS transistor, having a source terminal that receives the negative power supply voltage VL from the branch power supply wiring 26-2, a drain terminal that is connected to the drain terminal of the transistor 56, and a gate terminal that receives the clock signal. The transistor 58 delays the clock signal by a delay amount according to the value of the current regulated by the transistor 56 and supplies the thus delayed signal to the corresponding phase comparator 52 and to the transistor 58 at the next stage. By controlling the bias voltages supplied to the first delay element 48 and the second delay element 50, respectively, the fluctuation amounts (d1, d2) of the delay amounts in the delay elements can be the desired values.

Figure 8:
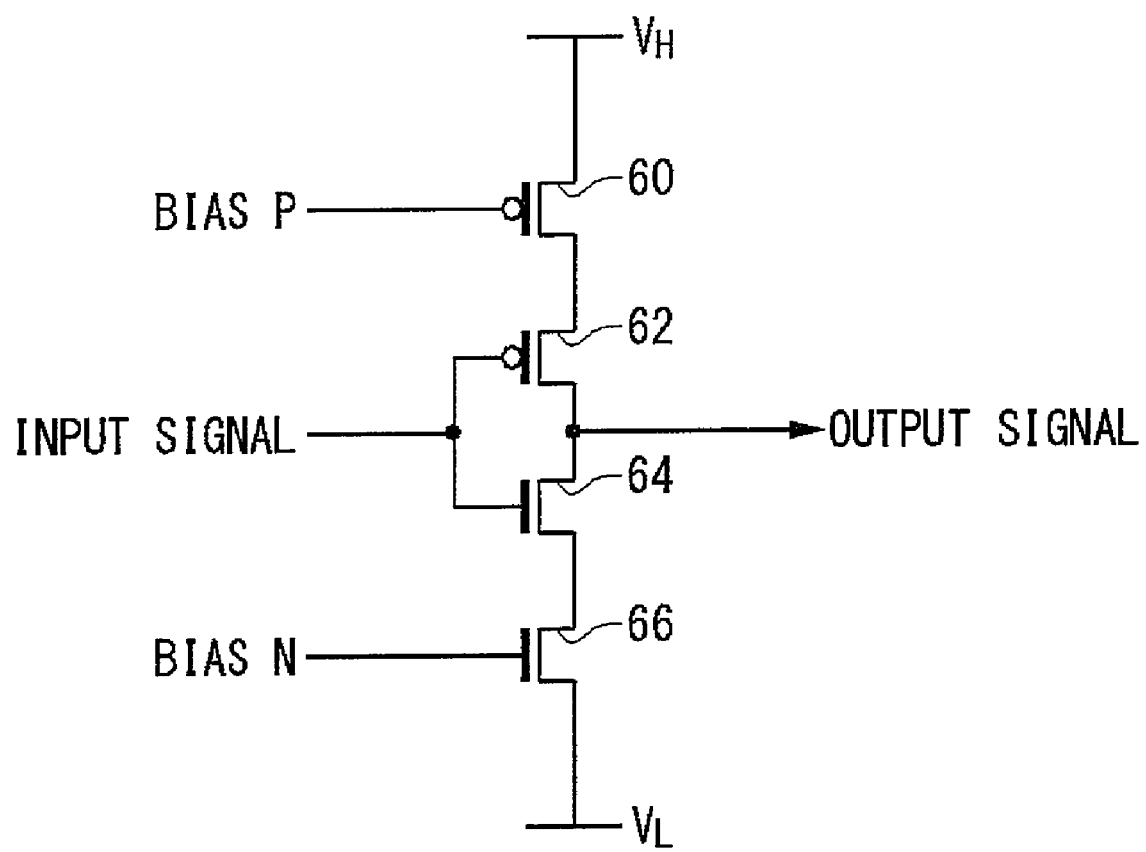
FIG. 8 shows another exemplary configuration of the first delay element 48.

FIG. 8 shows another exemplary configuration of the first delay element 48. The second delay elements 50 may also have the configuration shown in FIG. 8. The first delay element 48 of the present embodiment includes four transistors (60~66). The transistor 62 and the transistor 64 are configured as so-called CMOS circuits that delay the clock signal, supplied thereto as the input signal, by the delay amount according to the regulated current and that output the thus delayed signal.

The transistor 60 is, for example, a PMOS transistor, having a source terminal that receives the positive power supply voltage VH from the branch power supply wiring 26-1, a drain terminal that is connected to the source terminal of the transistor 62, and a gate terminal that receives a prescribed bias voltage P. In other words, the transistor 60 functions as a current source that regulates the current flowing to the transistor 62 according to the bias voltage P supplied thereto.

The transistor 66 is, for example, an NMOS transistor, having a source terminal that receives the negative power supply voltage VL from the branch power supply wiring 26-2, a drain terminal that is connected to the source terminal of the transistor 64, and a gate terminal that receives a prescribed bias voltage N. In other words, the transistor 66 functions as a current source that regulates the current flowing to the transistor 64 according to the bias voltage N supplied thereto. With such a configuration, the fluctuation amount of the delay amount of the first delay element 48 can be the desired value by controlling the bias voltage P and the bias voltage N.

Figure 9:
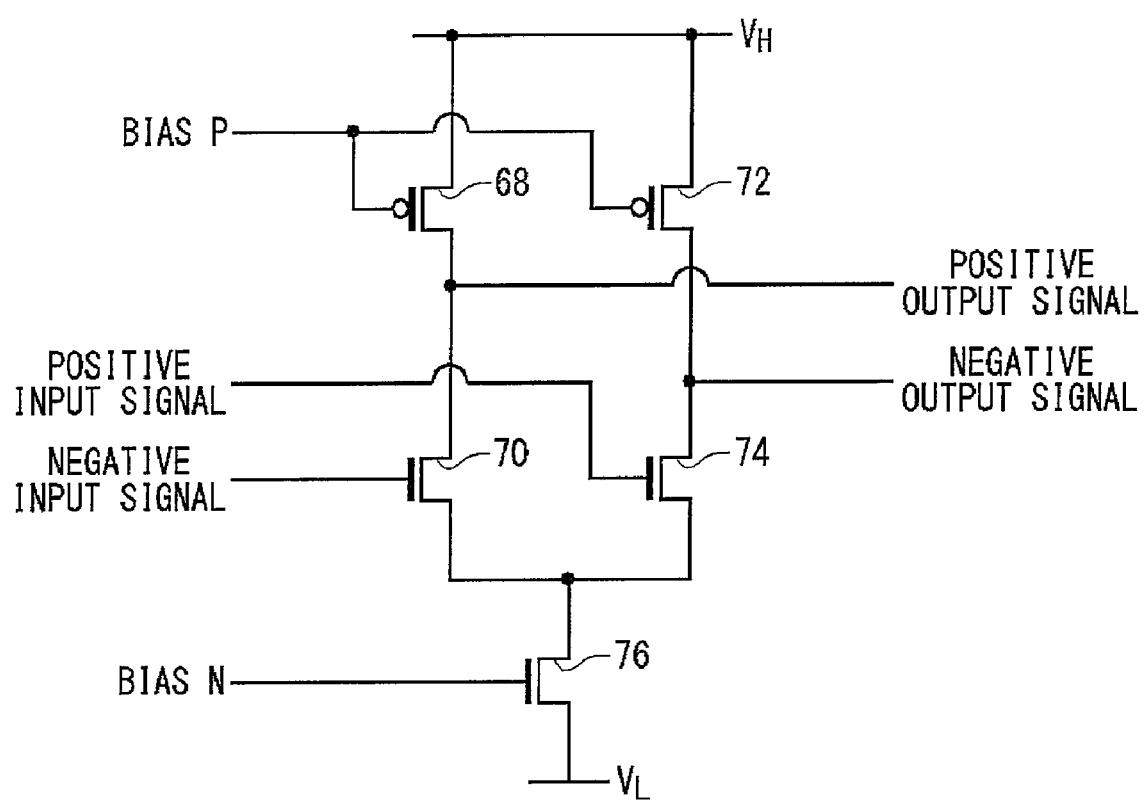
FIG. 9 shows another exemplary configuration of the first delay element 48.

FIG. 9 shows another exemplary configuration of the first delay element 48. The second delay elements 50 may also have the configuration shown in FIG. 9. The first delay element 48 of the present embodiment includes five transistors (68~76). The transistor 70 and the transistor 74 are so-called differential circuits, whose gate terminals are supplied with a negative input signal obtained by inverting the clock signal and with a positive input signal obtained by not inverting the clock signal, and that output differential output signals obtained by delaying the differential input signals by the delay amount according to the regulated current amount.

The transistor 68 and the transistor 72 are, for example, PMOS transistors having source terminals that receive the positive power supply voltage VH from the branch power supply wiring 26-1, drain terminals that are connected to the drain terminals of the transistor 70 and the transistor 74, respectively, and gate terminals that receive the prescribed bias voltage P. In other words, the transistor 68 and the transistor 72 function as current sources that regulate the current flowing to the transistor 70 and the transistor 74 according to the bias voltage P supplied thereto.

The transistor 76 is, for example, an NMOS transistor having a source terminal that receives the negative power supply voltage VL from the branch power supply wiring 26-2, a drain terminal that is connected to the source terminals of the transistor 70 and the transistor 74, and a gate terminal that receives the prescribed bias voltage N. In other words, the transistor 76 functions as a current source that regulates the aggregate current flowing to the transistor 70 and to the transistor 74. With such a configuration, the fluctuation amount of the delay amount of the first delay element 48, which delays the clock signal supplied thereto as the differential signal, can be controlled to be the desired value.

FIG. 10 shows an exemplary configuration of a bias generating section 78 that generates the bias voltages described in FIGS. 7 to 9. The bias generating section 78 may be disposed in the load fluctuation compensation circuit 40.

Figure 10A:
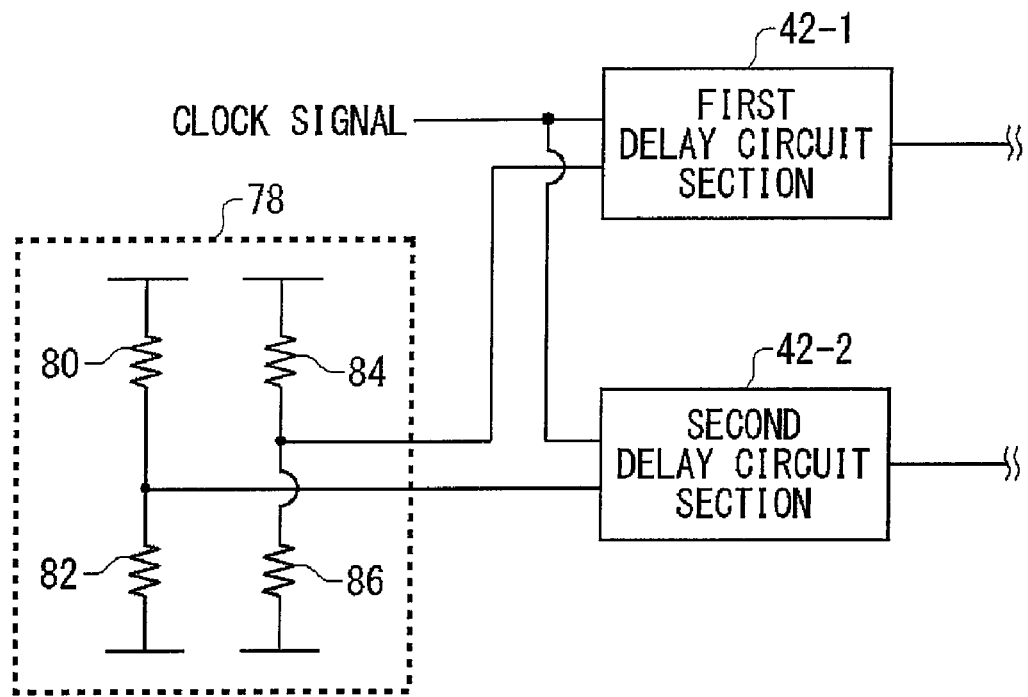
FIG. 10A shows an exemplary configuration of the bias generating section 78.

FIG. 10A shows an exemplary configuration of the bias generating section 78. The bias generating section 78 generates the bias voltages to be supplied to the first delay elements 48 and the second delay elements 50 as described in FIGS. 7 to 9. The bias generating section 78 includes a number of resistor groups equal to the number of types of bias voltages to be supplied to the first delay elements 48 and the second delay elements 50. In the present embodiment, the configuration of a bias generating section 78 that supplies two types of bias voltages is described.

The bias generating section 78 of the present embodiment includes two resistor groups, which include a resistor 80 and a resistor 82, and a resistor 84 and a resistor 86, respectively. In each resistor group, the two resistors are connected serially and the prescribed bias voltage is applied thereto. The bias voltage is divided between the two resistors in each resistor group and supplied to the first delay circuitry section 42-1 and the second delay circuitry section 42-2, respectively. The desired bias voltage can be generated by controlling the resistance value of each resistor.

Figure 10B:
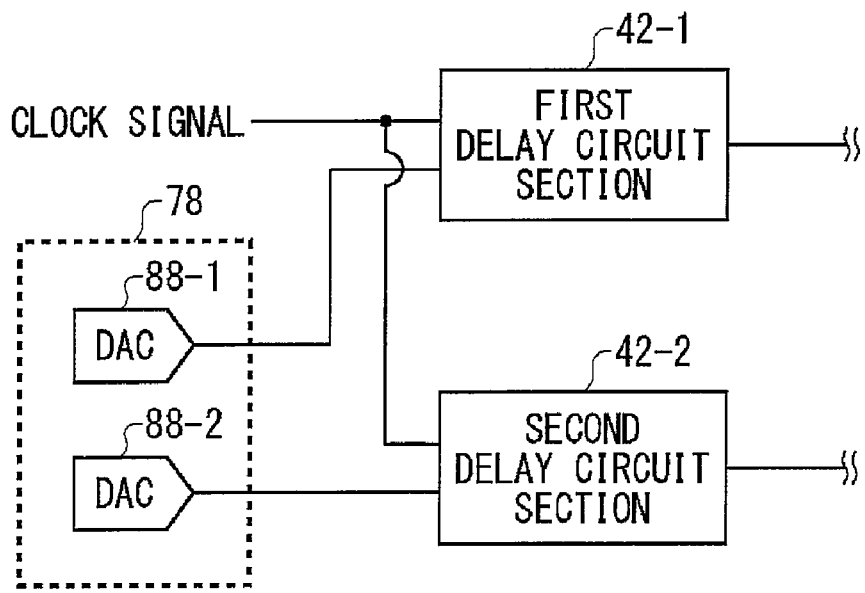
FIG. 10B shows another exemplary configuration of the bias generating section 78.

FIG. 10B shows another exemplary configuration of the bias generating section 78. The bias generating section 78 includes a number of digital-analog converters (DACs) 88 equal to the number of types of bias voltages to be supplied to the first delay elements 48 and the second delay elements 50. Each DAC 88 is supplied with digital data that indicates a voltage value of the bias voltage to be generated. By using such a configuration, the desired bias voltage can be generated.

Figure 11:
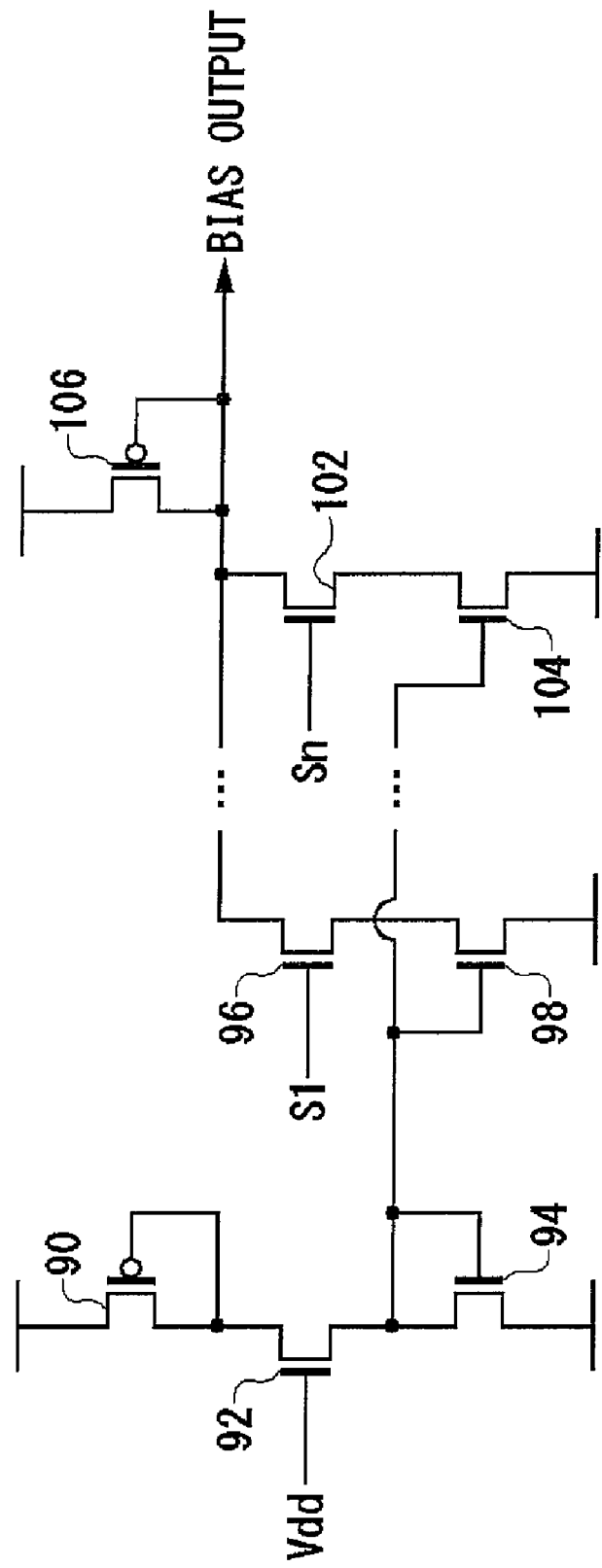
FIG. 11 shows an exemplary configuration of the DAC 88.

FIG. 11 shows an exemplary configuration of a DAC 88. The DAC 88 includes a plurality of transistors (90~106). A certain number n of the transistors (98~104) control the amount of current flowing to each transistor from among corresponding n transistors (96~102) based on the voltage applied to the gate terminals thereof. The n transistors (96~102) are each supplied with a bit signal corresponding to the digital data and are each turned on and off according to the supplied bit signal. In other words, the transistor 106 is supplied with a current according to the data value of the supplied digital data.

The transistors (90~94) generate the voltage that is supplied to the gate terminals of the n transistors (98~104). The gate terminal and the drain terminal of the transistor 106 are connected, and the transistor 106 generates the bias voltage according to the current supplied from the n transistors (96~102).

Figure 12:
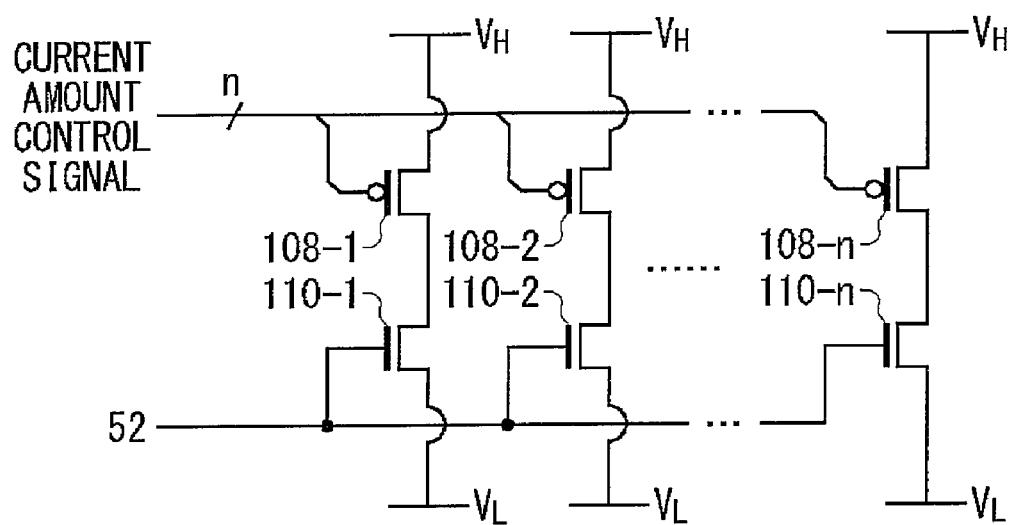
FIG. 12 shows an exemplary configuration of the load device 54.

FIG. 12 shows an exemplary configuration of the load device 54. The load device 54 includes a plurality of transistors 108 and transistors 110 connected serially between the branch power supply wiring 26-1 and the branch power supply wiring 26-2. The transistor 108 at each stage is, for example, a PMOS transistor having a source terminal that is connected to the branch power supply wiring 26-1, a drain terminal that is connected to the drain terminal of the corresponding transistor 110, and a gate terminal that receives the bit signal corresponding to a current amount control signal.

The transistor 110 at each stage is, for example, an NMOS transistor having a source terminal is connected to the branch power supply wiring 26-2, a drain terminal that is connected to the drain terminal of the corresponding transistor 108, and a gate terminal that receives the comparison result signal output by the corresponding phase comparator 52.

In other words, the current amount control signal can control the number of transistors 108 that are turned on. Furthermore, the transistors 110 are all turned off or all turned on according to the comparison result of the phase comparators 52. Therefore, in a case where the phase comparator 52 turns on the load device 54, the amount of current consumed by the load device 54 can be controlled to be the desired value by the current amount control signal. The load fluctuation compensation circuit 40 may generate the current amount control signal based on the current amount to be consumed by the performance circuit 202, and may be further provided with a current adjusting section that adjusts the amount of current consumed by each load device 54. For example, the current adjusting section may adjust the current consumed by each load device 54 such that a maximum value of the fluctuation amount of the current consumed by the performance circuit 202 becomes substantially equal to a maximum value of the fluctuation amount of the current consumed by the load circuit 46.

Figure 13:
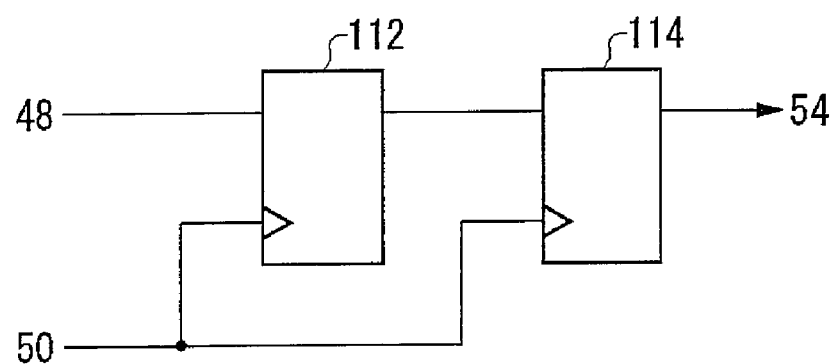
FIG. 13 shows an exemplary configuration of the phase comparator 52.

FIG. 13 shows an exemplary configuration of the phase comparator 52. The phase comparator 52 includes a dynamic D flip-flop 112 and a positive feedback D flip-flop 114. The dynamic D flip-flop 112 latches and outputs the clock signal output by the corresponding first delay element 48 according to the clock signal output by the corresponding second delay element 50 to supply the thus latched signal to the positive feedback D flip-flop 114.

The positive feedback D flip-flop 114 latches and outputs the signal output by the dynamic D flip-flop 112 using a positive feedback circuit, based on the clock signal output by the corresponding second delay element 50.

The phase comparator 52 may further include a buffer that delays the clock signal output by the second delay element 50 by a small amount and supplies the thus delayed signal as the clock signal of the positive feedback D flip-flop 114. By including such a buffer, the dynamic D flip-flop 112 and the positive feedback D flip-flop 114 can be made to operate as a delay line instead of a pipe line. In other words, the dynamic D flip-flop 112 and the positive feedback D flip-flop 114 can be operated using the same clock signal.

The dynamic D flip-flop 112 latches the data value of the clock signal supplied from the first delay element 48 using parasitic capacitance such as gate capacitance and wiring capacitance. However, because the dynamic D flip-flop 112 does not include a loop circuit, the logic output level becomes an undesirable level between level H and level L if the parasitic capacitance is not sufficiently charged. On the other hand, the phase width at which the intermediate level is output is extremely small, which has the benefit of having a very small hysteresis width.

The positive feedback D flip-flop 114 amplifies the signal using the positive feedback circuit and outputs the amplified signal. Therefore, hysteresis occurs in a case where the data signal (D) at the intermediate level is input from the dynamic D flip-flop 112. However, the hysteresis width is very small because the logic output of the dynamic D flip-flop 112 has a width of an intermediate level. Accordingly, by using the phase comparator 52 according to the present invention, the benefits of both the dynamic D flip-flop 112 and the positive feedback D flip-flop 114 can be included, thereby providing compatibility with higher frequency bands because the intermediate level logic output is not output and hysteresis does not occur.

Figure 14:
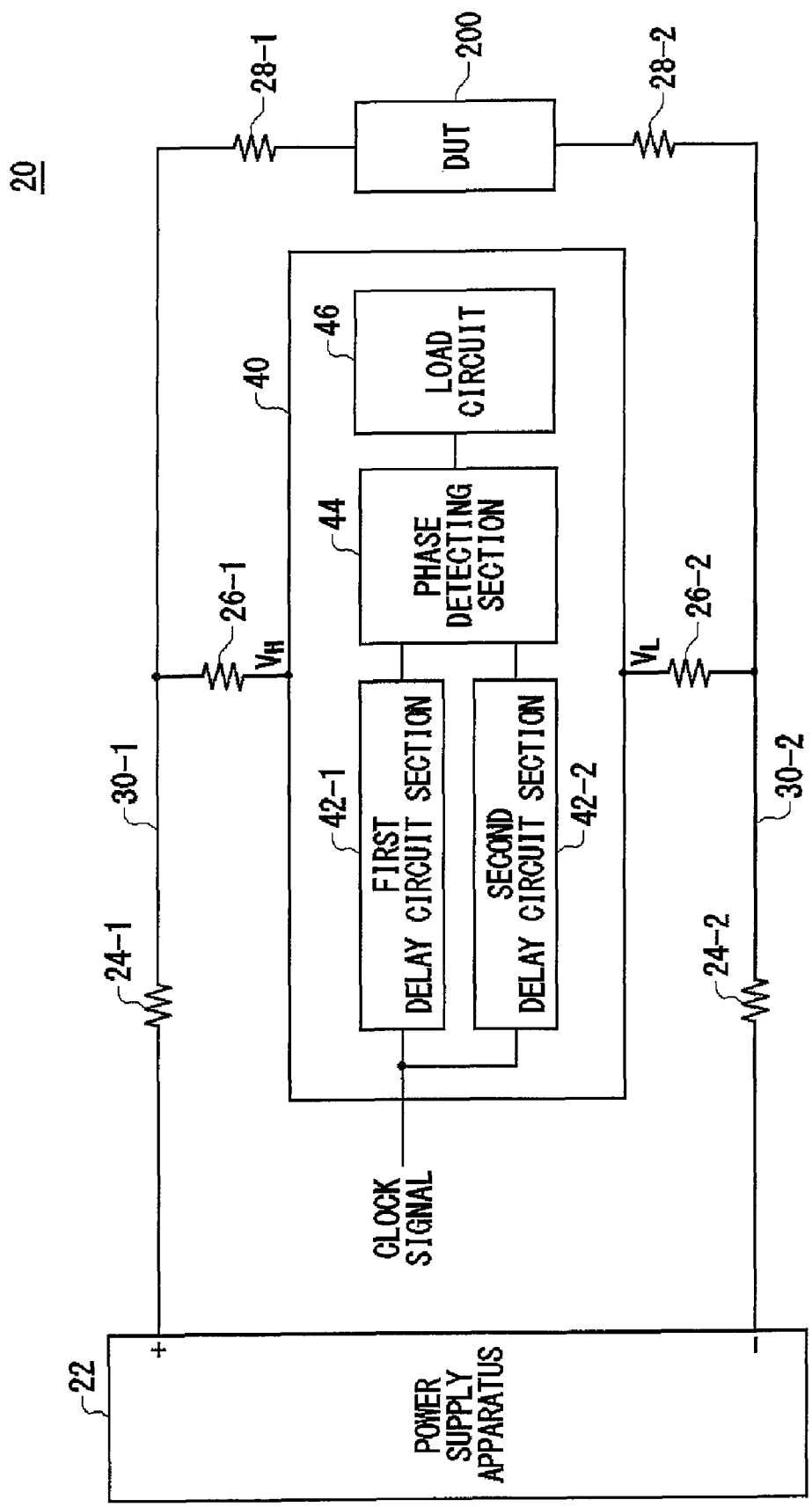
FIG. 14 shows an exemplary configuration of the power supply apparatus 20 shown in FIG. 1.

FIG. 14 shows an exemplary configuration of the power supply apparatus 20 shown in FIG. 1. FIGS. 2 to 13 described examples in which the load fluctuation compensation circuit 40 is provided within the electronic device 200, but the present embodiment describes an example in which the test apparatus 100 is provided with the load fluctuation compensation circuit 40. In such a case, it is desirable that the load fluctuation compensation circuit 40 be provided near the electronic device 200. For example, the load fluctuation compensation circuit 40 may be provided on a performance board loaded onto the electronic device 200 in the test apparatus 100.

The power supply apparatus 20 is provided with a power supply circuit 22, the power supply wirings 30-1 and 30-2 (referred to hereinafter collectively as 30), and the load fluctuation compensation circuit 40. The power supply circuit 22 generates the supply power supplied to the electronic device 200. The power supply circuit 22 of the present embodiment includes a positive output terminal and a negative output terminal, and is connected to the positive power supply input terminal and the negative power supply input terminal of the electronic device 200 via the positive power supply wiring 30-1 and the negative power supply wiring 30-2, respectively.

The power supply wirings 30 branch into the main power supply wirings 28-1 and 28-2 (referred to hereinafter collectively as 28) and the branch power supply wirings 26-1 and 26-2 (referred to hereinafter collectively as 26) at an area near the power supply input terminals of the electronic device 200. The main power supply wirings 28 connect the power supply circuit 22 to the electronic device 200 and supply the supply power to the electronic device 200. The branch power supply wirings 26 connect the power supply circuit 22 to the load fluctuation compensation circuit 40 and supply the supply power to the load fluctuation compensation circuit 40.

Here, the branching points near the power supply input terminals of the electronic device 200 may be positioned such that impedances of the main power supply wirings 28 from the branching point to the electronic device 200 be substantially zero or be small enough as to be essentially ignored. The branching points should at least be arranged at positions such that the impedances of the main power supply wirings 28 from the branching points to the electronic device 200 are less than the impedances of power supply wirings 30 from the power supply circuit 22 to the branching points.

It is desirable that the branching points be positioned such that the impedances of the branch power supply wirings 26 also be substantially zero or be small enough as to be essentially ignored. Furthermore, the branching points may be positioned such that the impedances of the main power supply wirings 28 from the branching points to the electronic device 200 are substantially equal to the impedances of the branch power supply wirings 26.

The load fluctuation compensation circuit 40 compensates the fluctuation of the supply power supplied to the electronic device 200. The load fluctuation compensation circuit 40 of the present embodiment has the same configuration as that of the load fluctuation compensation circuit 40 described in FIGS. 2 to 13.

By using such a configuration, the power supply voltage fluctuation caused by the fluctuation of the current consumed by the electronic device 200 can be compensated. Furthermore, by controlling the current consumed by the load circuit 46 disposed near the electronic device 200 without feeding the fluctuation of the power supply voltage back to the power supply apparatus 20, load fluctuation can be tracked quickly according to the compensation of the power supply voltage fluctuation.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, the power supply voltage fluctuation caused by the fluctuation of the current consumed by the performance circuit can be compensated. Furthermore, by controlling the current consumed by the load circuit disposed near the performance circuit without feeding the fluctuation of the power supply voltage back to the power supply circuit, load fluctuation can be tracked quickly according to the compensation of the power supply voltage fluctuation.

What is claimed is:

1. An electronic device that outputs an output signal in response to an input signal supplied thereto, comprising:
   a performance circuit that is supplied with the input signal and that outputs the output signal;
   a power supply wiring that receives a supply power from outside and supplies the supply power to the performance circuit; and
   a load fluctuation compensation circuit, branching from the power supply wiring, that compensates a fluctuation of the supply power supplied to the performance circuit, wherein the load fluctuation compensation circuit includes,
   a first delay circuitry section that delays a clock signal supplied thereto by a delay amount that fluctuates by a prescribed first fluctuation amount in relation to a unit fluctuation amount of a power supply voltage supplied to the performance circuit;
   a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the performance circuit;
   a load circuit that is connected to the power supply wiring in parallel with the performance circuit; and
   a phase detecting section that detects a phase difference between the clock signal output by the first delay circuitry section and the clock signal output by the second delay circuitry section and that controls an amount of current consumed by the load circuit based on the detected phase difference.

2. The electronic device according to claim 1, further comprising a branch power supply wiring that branches from the main power supply wiring supplying the supply power to the performance circuit near a power supply input terminal of the performance circuit, said branch power supply wiring supplying the supply power to the first delay circuitry section, to the second delay circuitry section, and to the load circuit.

3. The electronic device according to claim 1, wherein the phase detecting section controls the amount of current consumed by the load circuit such that the phase difference between the clock signal output by the first delay circuitry section and the clock signal output by the second delay circuitry section becomes equal to a prescribed phase difference.

4. The electronic device according to claim 1, wherein
   delay amounts of the first delay circuitry section and of the second delay circuitry section are substantially equal to each other when the power supply voltage supplied to the performance circuit becomes equal to a prescribed reference voltage, and
   the phase detecting section controls the amount of current consumed by the load circuit such that the power supply voltage supplied to the first delay circuitry section and to the second delay circuitry section becomes equal to the prescribed reference voltage.

5. The electronic device according to claim 4, wherein the phase detecting section
   increases the amount of current consumed by the load circuit when the phase of the clock signal output by the first delay circuitry section is ahead of the phase of the clock signal output by the second delay circuitry section, and
   decreases the amount of current consumed by the load circuit when the phase of the clock signal output by the first delay circuitry section is behind the phase of the clock signal output by the second delay circuitry section.

6. The electronic device according to claim 1, wherein
   the first delay circuitry section includes a plurality of first delay elements that are connected serially to each other and that sequentially delay the clock signal,
   the second delay circuitry section includes a plurality of second delay elements that are connected serially to each other, and that are disposed in a number equal to a number of the plurality of first delay elements, and that sequentially delay the clock signal,
   the phase detecting section includes a plurality of phase comparators, each of which detects a phase difference between the clock signals output by the corresponding first delay element and by the second delay element corresponding to the first delay element, and
   the load circuit includes a plurality of load devices that are disposed to correspond to the plurality of phase comparators, and each of which switches whether a prescribed amount of current is consumed thereby according to a comparison result by the corresponding phase comparator.

7. The electronic device according to claim 6, further comprising a phase difference generating section that delays one of the clock signal input to the first delay circuitry section and the clock signal input to the second delay circuitry section by a prescribed amount of time.

8. The electronic device according to claim 6, further comprising a current adjusting section that adjusts the amount of current consumed by each load device based on the amount of current to be consumed by the performance circuit.

9. A load fluctuation compensation circuit that compensates a fluctuation of supply power supplied to an electronic device, comprising:
   a first delay circuitry section that delays a clock signal supplied thereto by a delay amount that fluctuates by a prescribed first fluctuation amount in relation to a unit fluctuation amount of a power supply voltage supplied to the electronic device;
   a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device;
   a load circuit that is connected to a common power supply wiring in parallel with the electronic device; and
   a phase detecting section that detects a phase difference between the clock signal output by the first delay circuitry section and the clock signal output by the second delay circuitry section and that controls an amount of current consumed by the load circuit based on the detected phase difference.

10. A power supply apparatus that supplies a supply power to an electronic device, comprising:
    a power supply circuit that generates the supply power supplied to the electronic device; and
    a load fluctuation compensation circuit that compensates a fluctuation of the supply power supplied to the electronic device, wherein the load fluctuation compensation circuit includes,
    a first delay circuitry section that delays a clock signal supplied thereto by a delay amount that fluctuates by a prescribed first fluctuation amount in relation to a unit fluctuation amount of a power supply voltage supplied to the electronic device;

a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device;

a load circuit that is disposed in parallel with the electronic device and that has at least a portion of a power supply wiring in common with the electronic device; and a phase detecting section that detects a phase difference between the clock signal output by the first delay circuitry section and the clock signal output by the second delay circuitry section and that controls an amount of current consumed by the load circuit based on the detected phase difference.

11. A test apparatus that tests an electronic device, comprising:

a pattern generating section that inputs a test signal to the electronic device;

a judging section that makes a judgment concerning pass/fail of the electronic device based on an output signal of the electronic device; and a power supply apparatus that supplies a supply power to the electronic device, wherein the power supply apparatus includes, a power supply circuit that generates the supply power supplied to the electronic device; and a load fluctuation compensation circuit that compensates a fluctuation of the supply power supplied to the electronic device, wherein the load fluctuation compensation circuit includes, a first delay circuitry section that delays a clock signal supplied thereto by a delay amount that fluctuates by a prescribed first fluctuation amount in relation to a unit fluctuation amount of a power supply voltage supplied to the electronic device;

a second delay circuitry section that is disposed in parallel with the first delay circuitry section and that delays the clock signal supplied thereto by a delay amount that fluctuates by a second fluctuation amount, which is greater than the first fluctuation amount, in relation to the unit fluctuation amount of the power supply voltage supplied to the electronic device;

a load circuit that is disposed in parallel with the electronic device and that has at least a portion of a power supply wiring in common with the electronic device; and a phase detecting section that detects a phase difference between the clock signal output by the first delay circuitry section and the clock signal output by the second delay circuitry section and that controls an amount of current consumed by the load circuit based on the detected phase difference.

\* \* \* \* \*